United States Patent [19]

Fuller, Jr. et al.

[11] Patent Number: 5,784,260
[45] Date of Patent: Jul. 21, 1998

[54] STRUCTURE FOR CONSTRAINING THE FLOW OF ENCAPSULANT APPLIED TO AN I/C CHIP ON A SUBSTRATE

[75] Inventors: James W. Fuller, Jr., Endicott; Mary Beth Fletcher, Vestal; Joseph Alphonse Kotylo, Binghamton; Jeffrey Alan Knight, Endwell; David Michael Passante, Endicott; Allen F. Moring, Vestal, all of N.Y.

[73] Assignee: International Business Machines Corporation, Armonk, N.Y.

[21] Appl. No.: 657,469

[22] Filed: May 29, 1996

[51] Int. Cl.$^6$ .................. H05K 1/18; H05K 7/02
[52] U.S. Cl. .......... 361/762; 174/250; 257/723; 361/761; 361/777; 361/783
[58] Field of Search .............. 174/250, 253, 174/255, 256, 258, 260; 257/690, 693, 697, 700, 723, 724, 712, 713, 738, 778, 786, 787; 361/748, 760, 761, 762, 764, 777, 779, 783, 807, 809, 813, 820; 439/68, 69, 71, 83; 438/127, 108, 126; 264/272.17

[56] References Cited

U.S. PATENT DOCUMENTS

| | | |
|---|---|---|
| 4,902,610 | 2/1990 | Shipley ........................ 430/312 |
| 4,967,313 | 10/1990 | Berner . |
| 5,051,813 | 9/1991 | Schneider et al. . |
| 5,102,829 | 4/1992 | Cohn . |
| 5,120,678 | 6/1992 | Moore et al. . |
| 5,130,781 | 7/1992 | Kovac et al. . |
| 5,216,278 | 6/1993 | Lin et al. .................... 174/260 |
| 5,218,234 | 6/1993 | Tompson et al. .......... 257/787 |
| 5,251,806 | 10/1993 | Agarwala et al. . |
| 5,355,283 | 10/1994 | Marrs et al. ............... 361/760 |
| 5,436,203 | 7/1995 | Lin ............................. 438/126 |
| 5,650,593 | 7/1997 | McMillian et al. ....... 361/761 |

*Primary Examiner*—Donald Sparks
*Attorney, Agent, or Firm*—Calfee, Halter & Griswold LLp

[57] ABSTRACT

According to the present invention, a technique for controlling the flow of plastic encapsulant which is applied over an integrated circuit (I/C) chip wire bonded to wire pads formed on a chip carrier substrate is provided. This technique includes applying a barrier material to the substrate surrounding the wire bond pads, which barrier material is in the form of two walls projecting upwardly from the surface thereof, and defining a well between the walls to confine the flow of the encapsulant material. This prevents the encapsulant material from flowing past a desired defined boundary and covering the circuit connection pads which are not intended to be covered.

6 Claims, 2 Drawing Sheets

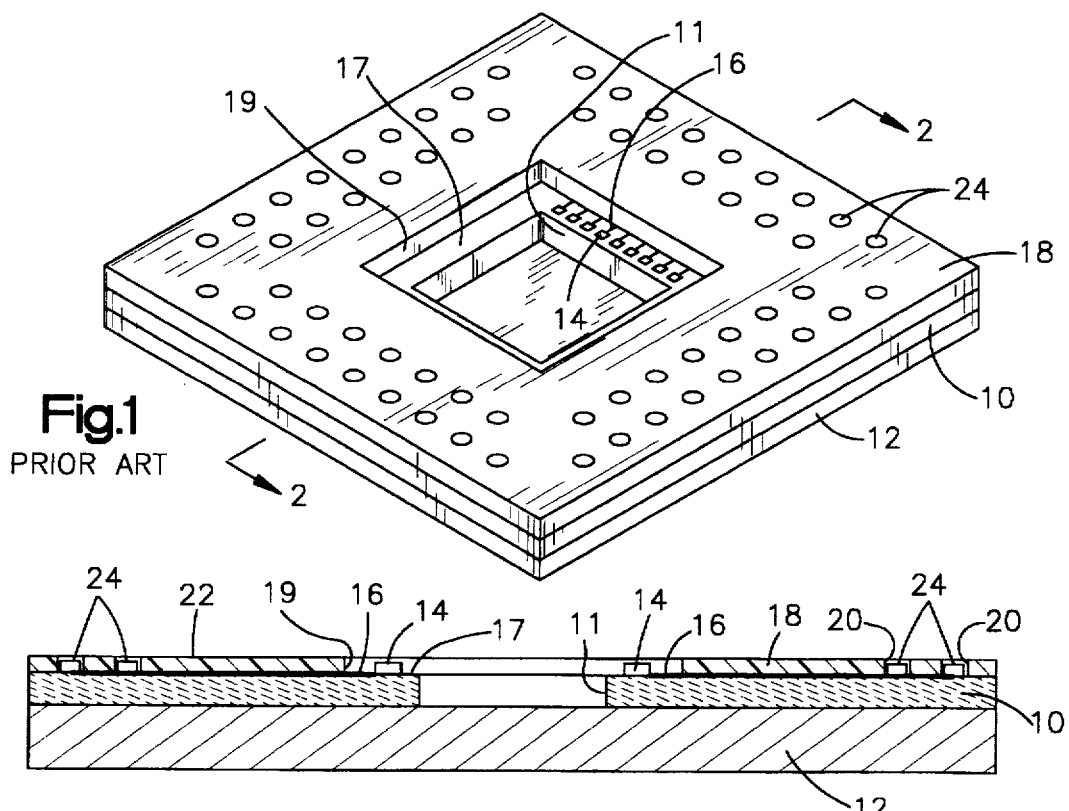
Fig.1 PRIOR ART
Fig.2 PRIOR ART
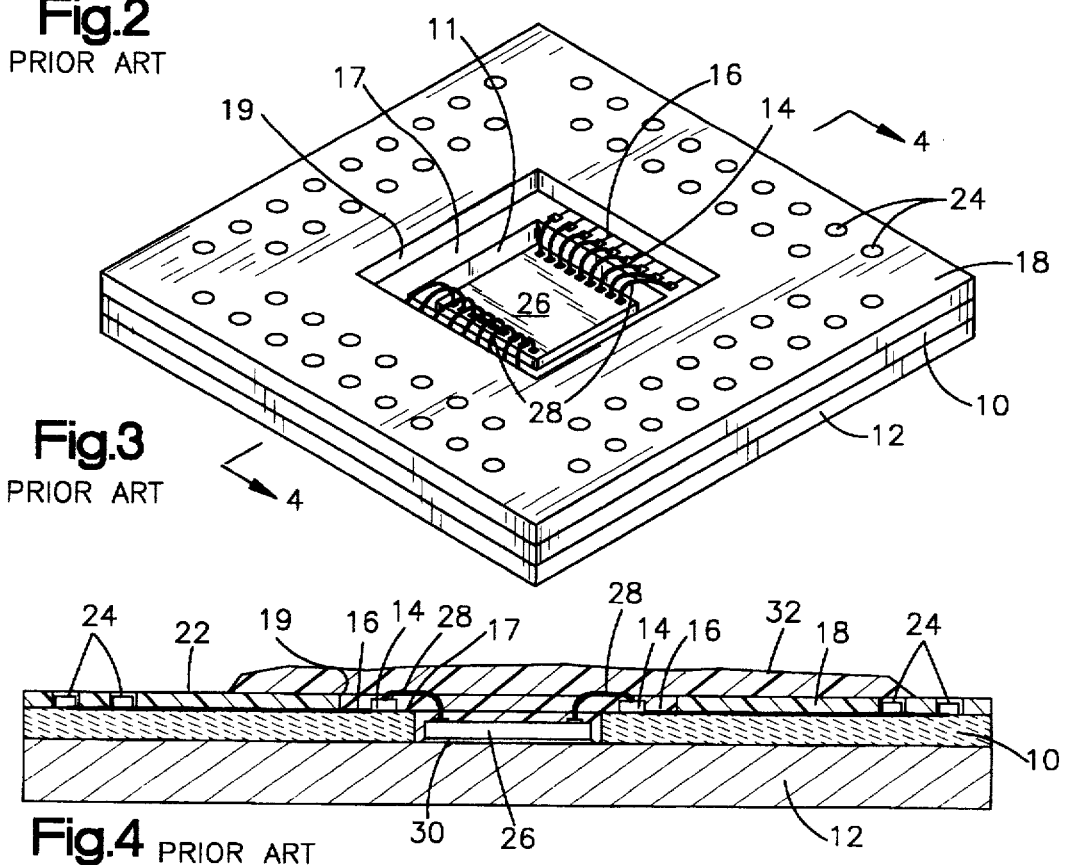
Fig.3 PRIOR ART
Fig.4 PRIOR ART

STRUCTURE FOR CONSTRAINING THE FLOW OF ENCAPSULANT APPLIED TO AN I/C CHIP ON A SUBSTRATE

FIELD OF THE INVENTION

This invention relates generally to the constraining of the flow of encapsulant material around an I/C chip, and more particularly a method and structure for constraining or restraining the flow of a plastic encapsulant as it flows, which encapsulates an I/C chip that is wire bonded to a dielectric substrate material.

BACKGROUND OF THE INVENTION

There are many techniques for forming a chip carrier structure on which an integrated circuit (I/C) chip is attached, and which carrier in turn is attached to a PC board or card. In one technique known as wire bonding, an I/C chip having a plurality of wire leads extending therefrom has these leads bonded to lead wire bond pads formed on one surface of a substrate of a dielectric material which forms a chip carrier. Following the bonding process, a plastic encapsulating material, such as Hysol 4450 or Hysol 4451 sold by Hysol Corp. which are epoxy resins, is applied as a viscous fluid which cures and encapsulates the chip, the lead wires and the wire bond pads so as to protect the chip and its attachment both from exposure to the atmosphere and to any unwanted mechanical contacts. This carrier is then attached to a circuit board or card to form a populated circuit board or card structure.

One conventional way of attaching the chip carrier substrate to the circuit board or card is by means of solder ball connections in which ball grid array (BGA) pads are provided on the carrier which are connected by subsurface wiring on the chip carrier to the wire bond pads, with the BGA pads being connected by the solder balls to corresponding pads on the circuit board or circuit card. These BGA pads may be formed on the same side as the wire bond pads to which the wires of the chip are attached, or they may be formed on the opposite side. If they are formed on the opposite side from that on which the wire bond pads are located and to which the I/C chip is attached and there are no other electrical connections on the same surface as the wire bond pads for the I/C chip, then the step of applying the plastic encapsulant to the chip, the wires and the wire bond pads does not have close tolerances as to how much spread of the encapsulant can be tolerated on the surface of the chip carrier substrate. However, if the BGA pads or other electrical connections are in relatively close proximity to the wire bond pads on the same side of the chip carrier substrate, then the control of the spread of the encapsulant for encapsulating the chip, the wires and the wire bond pads becomes quite critical. On the one hand, it is necessary that sufficient encapsulant be applied to completely cover not only the chip and the wires thereon, but also the wire bond pads on the surface of the chip carrier substrate, providing the necessary protection as indicated above. On the other hand, it is necessary to restrict or constrain the flow or run-out of this encapsulating material so that it does not cover the BGA pads or other electric connections on the surface, thereby preventing electrical connections from being made in a subsequent manufacturing step, e.g., joining the chip carrier to the circuit board or card substrate.

One proposed solution to constrain or restrict the flow of the encapsulant material was to build a wall of material around the wire bond pads to separate the wire bond pads from the BGA pads so as to physically prevent the encapsulant from flowing if there was somewhat of an excess of encapsulant above and beyond what was needed to cover the chip, the wires and the wire bond pads. This has proved ineffective for two reasons. One principal reason is that the surface tension of the encapsulant material, together with the nature of the substrate of the chip carrier, allowed or indeed caused the encapsulant material to run over the wall and thereby defeat the purpose of the wall by allowing the encapsulant to reach electrical connections such as the BGA pads on the other side of the wall. Another reason, coupled with the surface tension of the encapsulant and the surface characteristics of the substrate, is that if a wall is physically constructed between the BGA pads and the wire bond pads, the sides of the wall tend to be sloping and thus promote the flow of the encapsulant material, thus enhancing the surface tension action.

Another proposal to restrict or constrain encapsulant material was to form a trench into the substrate surrounding the wire bond pads between the wire bond pads and the BGA pads so as to receive the encapsulant material. This also proved to have a disadvantage in that the surface tension of the encapsulant material often prevented it from entering into the trench. While this is effective to prevent the unintended outward flow, nevertheless it was not a satisfactory solution in many instances because the trench around the wire bond pads exposed subsurface wiring which was required to be covered, and if the encapsulant material did not enter the trench, it would leave this subsurface wiring exposed. Thus, both solutions, of a single wall or a trench, proved to be unsatisfactory to constraining or restricting the flow of encapsulant material while encapsulating an I/C chip wire bonded to wire bond pads on the dielectric substrate when BGA pads were located on the same side and in relatively close proximity to the I/C chip being bonded.

SUMMARY OF THE PRESENT INVENTION

According to the present invention, a method and structure for controlling the flow of a plastic encapsulant material which is applied over an I/C chip wire bonded to a series of wire bond pads formed on a substrate is provided. A barrier of material is applied to the substrate surrounding the wire bond pads, which barrier projects upwardly from the surface of the substrate on which the wire bond pads are located. Preferably the barrier material is a photopatternable material and more preferably a photoimagable liquid solder mask. A trench is formed within the barrier material, preferably by photolithographic methods, and the walls of the barrier material are made smooth and essentially perpendicular to the substrate, i.e., both the interior wall defining the trench and the exterior wall facing inwardly and away from the wire bond pads. An I/C chip having lead wires attached thereto is then wire bonded to the wire bond pads, and a liquid plastic encapsulant material, such as Hysol 4450 or Hysol 4451, is applied to encapsulate the chip, the wires and the wire bond pads. The barrier structure which essentially is a depression separated by two walls extending from the surface of the substrate act as a barrier to the flow of the encapsulant material past the barrier material. The barrier which includes a wall inwardly facing toward the wire bond pads, while susceptible to having the encapsulant material extend over the wall, provides a trench on the other side of this wall into which the surface tension tends to prevent the encapsulant material from flowing. If, however, the encapsulant material does flow into the trench, it is constrained therein to the extent and has essentially dissipated itself with little chance of crawling over the next wall and any significant amount of spreading on the surface of the substrate.

DESCRIPTION OF THE DRAWING

FIG. 1 is a perspective view of a portion of a conventional chip carrier for wire bonded chips prior to the attachment of the chip;

FIG. 2 is a longitudinal, sectional view substantially along the plane designated by line 2—2 of FIG. 1;

FIG. 3 is a perspective view, similar to FIG. 1, showing the mounting of an I/C chip on the substrate;

FIG. 4 is a sectional view similar to FIG. 2, showing an I/C chip attached and encapsulated with encapsulant according to the prior art;

DESCRIPTION OF THE PREFERRED EMBODIMENT

Figure 5:
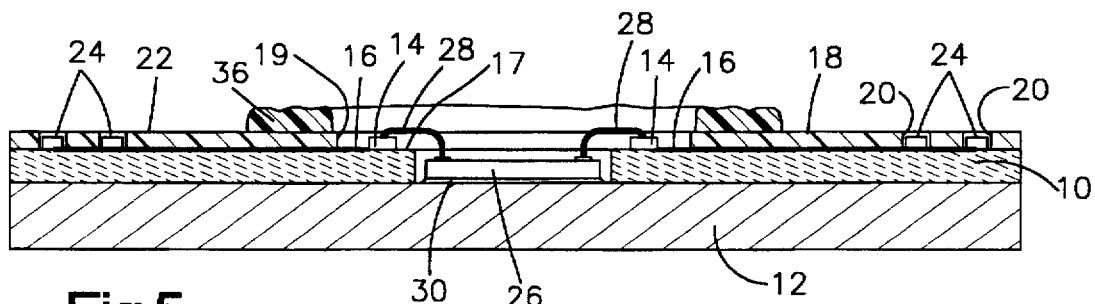
FIGS. 5–7 are longitudinal, sectional views similar to FIG. 2, showing the steps of forming a carrier according to the present invention.

Referring now to the drawings, and for the present to FIGS. 1 and 2, one conventional design of a chip carrier for wire bonded chips is shown. In this particular design, the chip carrier includes a dielectric substrate 10 which can be made of any suitable, known material, such as FR4 (a glass-filled epoxy), polyimide or other well-known material. The substrate 10 has an opening 11 formed therein, which opening can be formed by punching or routing. A copper heat sink 12 is secured to the underside of the substrate 10, thus forming with the opening 11 a chip-receiving well. The formation of this structure is shown in detail in U.S. application Ser. No. 08/390,344, filed Feb. 15, 1995, entitled "Organic Chip Carrier for Wire Bond Type Chips." Alternatively, the chip-receiving well can be formed by controlled depth routing. A series of wire bond pads 14 are disposed on the substrate 10 surrounding the opening 11. The substrate has circuit wiring 16 connected to the wire bond pads 14 and extending therefrom on the top surface 17 of the substrate. A layer of dielectric material 18, which is preferably a cured dry film solder mask material, overlays the top surface 17 of the substrate, although other materials such as liquid solder mask material could be used. This layer of material 18 is typically 1.5–3 mils thick. An opening 19 is formed in the solder mask 18 surrounding the wire bond pads 14 and exposing portions of the circuit wiring 16. A suitable material for the solder mask material 18 is Varcel 8130, a dry film material sold by DuPont Corporation, and which is photopatternable. Windows or bottomed holes 20 are formed in the solder mask 18, extending from the top surface 22 of the solder mask 18 exposing Ball Grid Array (BGA) pads 24, which are part of the circuit wiring 16 therebelow. As thus far described, the chip carrier is of conventional design.

As shown in FIGS. 3 and 4, an I/C (integrated circuit) chip 26 is attached to the wire bond pads 14 by lead wires 28 extending from the I/C chip 26. The wire bond pads 14 are selected in number, location and arrangement such that they provide for contact for the lead wires 28 on the I/C chip 26. According to conventional practice, the chip 26 is secured by a thermal bonding adhesive 30, such as silver-filled epoxy, to the copper heat sink 12 at the bottom of the opening 11 defining the chip-receiving well.

In order to protect the chip 26, the lead wires 28 and the exposed circuit wiring 16 from the elements and from mechanical damage, the chip 26, the lead wires 28, and exposed portions of the circuit wiring 16 are covered with a dielectric encapsulant 32 as shown in FIG. 4. The encapsulant which conventionally is a thermoset polymer, which has a viscosity controlled to assure adequate flow around the components while covering the components, and which will allow release of any entrapped bubbles while not promoting wire sweep. The encapsulant is applied as a liquid and flows out from the chip 26 and well 12 to cover the lead wires 28, the bond pads 14 and the exposed circuit wiring 16 and is then cured. As indicated above, suitable encapsulants include Hysol 4450 and Hysol 4451. Unfortunately, because of the "small" dimensions, the nature of the encapsulant, and the surface 22 of the solder mask, the extent of the flow of the encapsulant 32 cannot be precisely controlled. Thus, it may flow and properly cover the bond pads 14 and the exposed circuit wiring 16, but stop short of any of the BGA pads 24 as shown on the left side of FIG. 4. However, it may flow farther and actually cover one or more of the BGA pads 24, as shown on the right hand side of FIG. 4. This uncontrolled, excess flow is unacceptable since it prevents attachment of the BGA pads to the solder balls which will form a connection to a substrate, as will be described subsequently.

As was described previously, attempts to control this flow included providing a trench in the solder mask material 18 between the opening 19 in the solder mask and the BGA pads 24. This proved unsuccessful since the surface tension often prevented the encapsulant from entering the trench, thus leaving exposed the underlying circuit wire which was exposed by forming the trench. The provision of a wall, rather than a trench, between the opening 19 and the BGA pads 24 also proved unsuccessful in that the encapsulant material tended to climb over the wall and continue and cover the BGA pads 24 in many instances.

Figure 6:
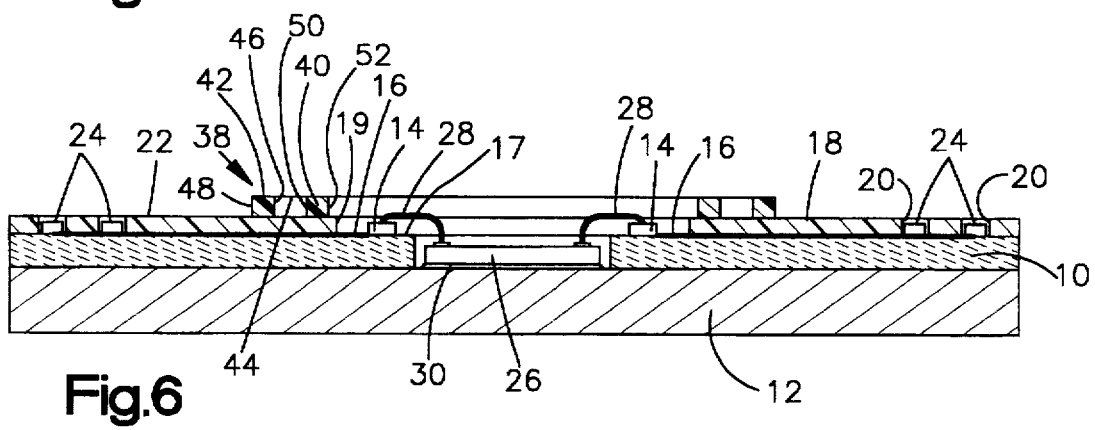
Figure 7:
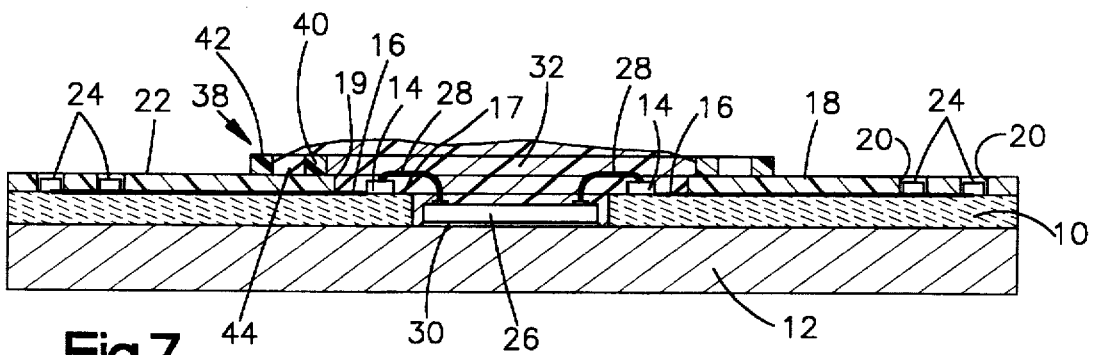

Referring now to FIGS. 5, 6 and 7, a technique for constraining the unwanted flow of encapsulant during encapsulating operations is shown. A conventional chip carrier as shown in FIGS. 1 and 2 is used as a starting point. To a conventional chip carrier, a barrier material 36 is applied onto the top surface 22 between opening 19 and the BGA pads 24 preferably by screen printing as shown in FIG. 5. This material preferably is a liquid solder mask material such as Enthone DSR 3241, sold by Enthone OMI Inc., which is a negative acting solder mask material. The barrier material is then patterned with light, preferably collimated light, and developed, with the unexposed material washed away to provide the restraining or constraining structure 38 shown in FIG. 6. This structure includes an inner wall 40 and an outer wall 42, with a groove or well 44 defined therebetween. The wall 42 has an inner surface 46 and an outer surface 48, both of which are preferably smooth and essentially perpendicular to the top surface 22 of the solder mask material 18, but high enough to perform the function of constraining the flow of encapsulant. The wall 40 has an inner surface 50 and an outer surface 52, both of which are preferably smooth and extend essentially vertical to the top surface 25 of the solder mask 18. The size of the walls 40 and 42 may vary, although it is preferred that they be between 3 and 15 mils wide, with the well 44 being at least 2 mils wide. The height of the walls 40 and 42 preferably should be about 1–3 mils high, but in any event should not be so high as to interfere with the joining of the carrier to a board as will be described presently.

Of course, the entire surface of the substrate could be screen flooded, or a solid sheet of photoimagable material could be used, and the unexposed portions removed during developing. However, this would use a greatly increased amount of photo-patternable material, increasing the cost both of the material and of handling the undeveloped material washed away during developing.

As shown in FIG. 7, an I/C chip 26 is attached to the circuit carrier by bonding the lead wires 28 on the chip 26 to the wire bond pads 14 as described previously. Encapsulant material 32, which again is preferably Hysol 4450 or Hysol 4451, is applied over the chip 26, around the wires 28, and the exposed circuit wiring 16 as shown in FIG. 7. As shown on the right-hand side of FIG. 7, the encapsulant has flowed out and met the wall 40 and has been halted in its flow thereby; but, on the left-hand side, the material when it encountered the wall 40 was sufficient in volume and geometry such that it flowed over the wall. However, the excess material 32 flowing over the wall 40 is trapped in the groove or well 44 and does not travel past this well over the wall 42. Thus, the encapsulant is prevented from coating onto the BGA pads 24 as was the case in the prior art. The top of the encapsulant is typically 14–16 mils above the top of the layer 18.

Figure 8:
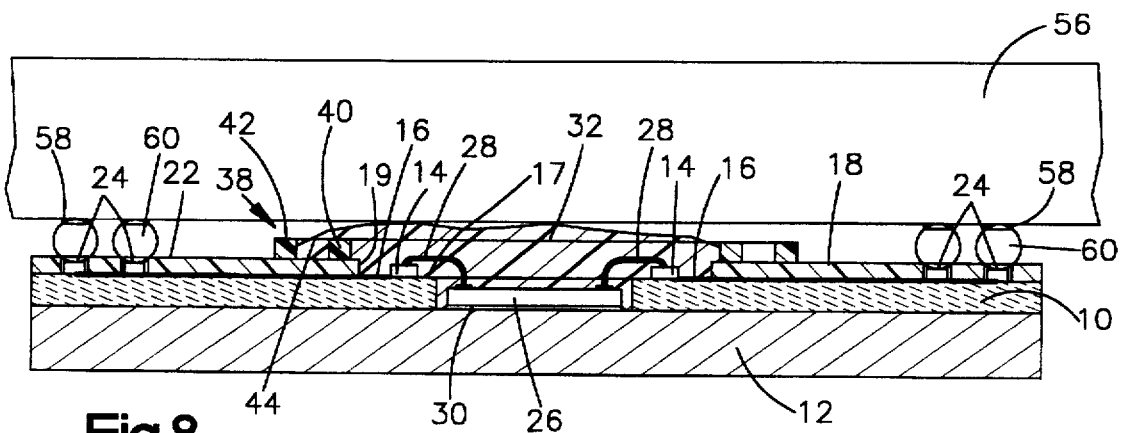
FIG. 8 is a longitudinal, sectional view of a carrier with the chip mounted on a circuit board by solder ball technology according to the invention.

As shown in FIG. 8, the BGA pads 24 are all uncovered, and therefore can provide the attachment of the chip carrier 10 to a circuit board 56 having corresponding BGA pads 58 thereon, with solder balls 60 bonding the BGA pads 58 to the BGA pads 24. The solder balls are typically 24–25 mils in diameter.

Accordingly, the preferred embodiment of the present invention has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A substrate structure for the reception of wire bonded I/C chips thereon, comprising:
    a dielectric substrate having at least one surface with wire bond pads formed thereon,
    a barrier material surrounding said wire bond pads and projecting from said one surface of said substrate,
    said barrier material having formed therein a well bounded on both sides by walls extending from said one surface of said substrate; and
    a plurality of electrical contacts surrounding said barrier material.

2. The invention as defined in claim 1 wherein at least some of said electrical contacts are ball grid array pads, at least some of which are connected to at least some of said wire bond pads by electrical circuitry disposed within said substrate.

3. The invention as defined in claim 1 wherein said barrier material is a cured photoimaged material.

4. The invention as defined in claim 3 wherein said one surface of said substrate is defined at least in part by a solder mask material.

5. The invention as defined in claim 4 wherein said barrier material is a cured photoimaged solder mask.

6. The invention as defined in claim 5 wherein an I/C chip having a plurality of wire leads is wire bonded to said wire bond pads, and wherein an encapsulant encapsulates said chip, lead wire, and wire bond pads, and extends no farther than said well.

* * * * *